United States Patent [19]

Brust

[11] Patent Number: 5,185,571

[45] Date of Patent: Feb. 9, 1993

[54] PROCESS AND SYSTEM FOR THE ASYNCHRONOUS MEASUREMENT OF SIGNAL COURSES

[76] Inventor: Hans-Detlef Brust, Martin-Luther-Str. 2, D-6602 Dudweiler, Fed. Rep. of Germany

[21] Appl. No.: 646,792

[22] PCT Filed: Sep. 1, 1989

[86] PCT No.: PCT/DE89/00570

§ 371 Date: Jan. 31, 1991

§ 102(e) Date: Jan. 31, 1991

[87] PCT Pub. No.: WO90/02955

PCT Pub. Date: Mar. 22, 1990

[30] Foreign Application Priority Data

Sep. 1, 1988 [DE] Fed. Rep. of Germany ....... 3829770

[51] Int. Cl.⁵ .............................................. G01R 31/28
[52] U.S. Cl. ................................ 324/158 R; 250/310
[58] Field of Search .............. 324/158 R, 158 D, 73.1; 250/310, 311

[56] References Cited

U.S. PATENT DOCUMENTS

| | | | |
|---|---|---|---|
| 4,220,853 | 9/1980 | Feuerbaum et al. | 324/158 D |
| 4,413,181 | 11/1983 | Feuerbaum | 324/158 D |
| 4,486,660 | 12/1984 | Feuerbaum | 324/158 R |
| 4,634,972 | 1/1987 | Fazekas | 324/158 R |

Primary Examiner—Ernest F. Karlsen
Attorney, Agent, or Firm—Evenson, Wands, Edwards, Lenahan & McKeown

[57] ABSTRACT

In conventional processes of electron beam measuring, the measurement of signals at a measuring point of a sample occurs following scanning and averaging procedures with the aid of potential contrasts. For this purpose, the point of measurement is impinged upon with a short primary electron pulse, which is released by a trigger pulse, which is synchronous to the signal to be measured. The average value of the secondary electron pulse stream resulting from very many primary electrons is measured and is a measure for the signal at the measuring position at the point in time of the impingement of the primary electrons. The generation of primary electron pulses occurs with a beam modulation system. As the primary electron pulses are generated in response to the trigger pulses, this system has to be designed very widebanded. In operation, the sample is impinged upon with primary electron pulses completely in independence of the signal course at the measuring position, and the resulting secondary electron stream is registered. For the evaluation, only the secondary electron pulses resulting from the primary electron pulses occurring in a defined temporal interval from the respective trigger pulse are utilized. In order to record a complete measurement curve, this temporal interval is varied.

29 Claims, 7 Drawing Sheets

PROCESS AND SYSTEM FOR THE ASYNCHRONOUS MEASUREMENT OF SIGNAL COURSES

FIELD OF THE INVENTION

The present invention relates to a process for the asynchronous measurement of signal courses at one or several points of measurement of a sample as well as to an arrangement for carrying out this process.

BACKGROUND OF THE INVENTION

Checking the mode of function of high-integrated circuits usually occurs in computer controlled test systems, in which the extant errors can be identified by analyzing the voltage level measured at the outputs of the examined circuit in dependence on the respectively fed bit pattern, however they can only be located with great difficulty. For this reason, additional measurements must be carried out inside high-integrated circuits, particularly during the development phase.

Corpuscular beam measuring processes, especially, electron beam measuring, used in all the fields of development and fabrication of micro-electronic components have proven to be particularly suited for this purpose. With the aid of these measuring techniques, the electric potential distribution in integrated circuits can, by way of illustration, be imaged (here the processes known to those skilled in the in the art under the term "voltage coding", respectively "logic state mapping" are to be mentioned) or the temporal potential course can be determined at a single point of junction ("waveform measuring"). A survey of the test procedures currently usually employed is given in the publication "Electron Beam Testing" by E. Wolfgang (perdiodical "Micro-electronic Engineering", issue 4, 1986, pages 77–106). One of the most important measuring processes in electron beam measuring is so-called waveform measuring, which is described in detail in the publication "Electron Beam Testing: Methods and Applications" by H.-P. Feuerbaum (periodical "Scanning", issue 5, 1983, pages 14–24), in particular on pages 12 to 14 and with the aid of which the course of the voltage can be measured at a point of measurement of a sample.

In waveform measuring a finely focussed primary electron beam is aimed at the measuring position to be examined of the integrated circuit. The primary electrons impinging there release from the surface of the sample secondary electrons, which are influenced by the electrical potentails on the surface of the sample. This influencing manifests itself in a secondary electron stream, which is dependent on the potential at the measuring position, respectively in an energy shift of the secondary electrons, which also is determined by the electric potential at the measuring position and which can be measured with the aid of an energy spectrometer. This effect is referred to as potential contrast. As the sensors required for registering the secondary electrons usually only have a relatively small bandwidth of a few MHz, a scanning process, in which the temporal course of the signal is scanned at the measuring site for a trigger signal similar to a sampling oscilloscope with short electron pulses, has to be employed in order to achieve high time resolution. As each primary electron pulse can only contain very few electrons, an average is made of the scanning values of very many measuring cycles in order to attain an adequate signal-to-noise ratio.

As each trigger pulse releases a primary electron pulse, yet the trigger signal can barely be influenced, the generation of the primary electron pulses has to be very widebanded. This, however, encounter considerable problems if working with very short primary electron pulses desired for attaining high time resolution.

The object of the present invention is to decouple triggering and primary pulse generation, and thereby making it possible to use narrowbanded arrangements for generating even very short primary pulses.

SUMMARY OF THE INVENTION

The aforegoing object is solved in accordance with the present invention by a process for measuring the state and/or temporal course of a recurring signal at least at one point in time and at least at one measurement point of a sample. The process comprises the steps of: providing a trigger signal which stands in a defined temporal relationship to the course of the recurring signal; impinging a primary beam upon the sample, the primary beam being formed of individual primary beam pulses which are either primary corpuscular or primary radiation pulses; generating and controlling the primary beam pulses via either a first modulation signal or independently from external control while providing a second modulation signal synchronous to the primary beam pulses; the individual primary beam pulses or the first and second modulation signals consecutively follow one another at random temporal intervals; deriving a secondary signal having values influenced from an interaction between the primary beam and the sample; registering and recording at least a part of the values of the secondary signal resulting from the interaction between the primary beam and the sample; processing the values of the secondary signal to a measured value including selecting the values for processing in such a manner that only values resulting from the interaction between the primary beam and the sample occurring at points in time having a defined temporal relationship to the trigger signal and to the recurring signal, respectively, contribute to the measured value. The process is carried out with an apparatus.

The advantage achieved with the present invention lies, in particular, in the fact that specially designed narrowbanded arrangments can be utilized for generating very short primary pulses. In this way, measurement of signal courses with very high time resolution can be carried out with little effort. Moreover, compared to the known state of the art processes, the sensitivity to interferences (such as from charging or contamination) is reduced. Furthermore, not only periodically recurring, but also statistically recurring signals can be measured.

BRIEF DESCRIPTION OF THE DRAWINGS

The present invention is made more apparent using the accompanying drawings, in which.

The same designations are used to refer to the same signals and circuit elements, in the figures.

DETAILED DESCRIPTION OF THE DRAWINGS

Although the following preferred embodiments relate to an electron beam measuring apparatus, the present invention is to be understood in such a manner that ions or other corpuscles can be used instead of electrons, both as primary corpuscles as well as secondary corpuscles. Just as radiation, like e.g. laser or X-ray radiation, may also replace the primary, respectively secondary corpuscles.

Figure 1:
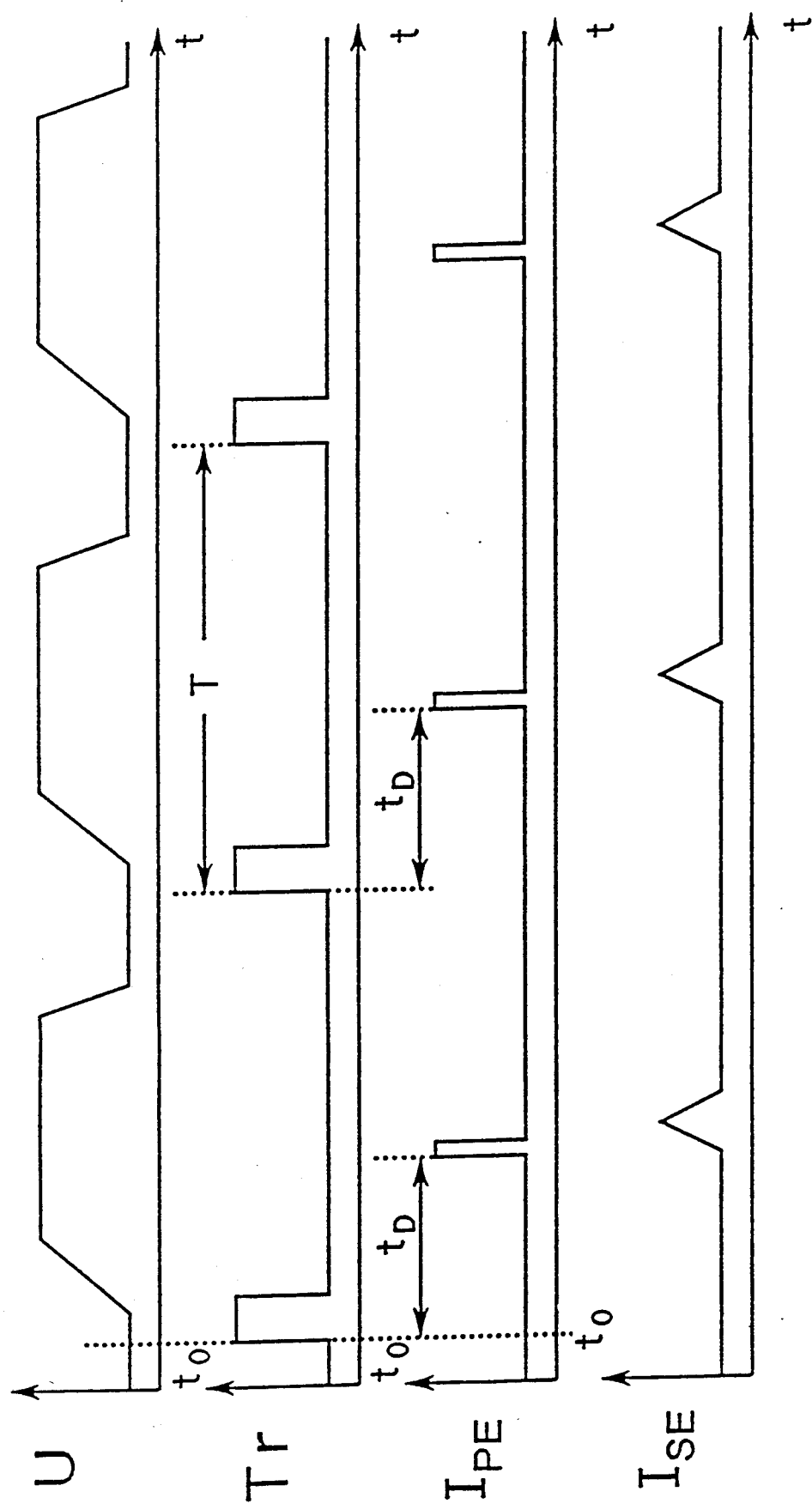
FIG. 1 shows the principle of operation of the conventional process according to the state of the art using a timing diagram of some of the signals occurring in this process.

FIG. 1 illustrates the principle of operation of conventional waveform measuring according to the state of the art, as it is described, by way of illustration in the cited publication by H.-P Feuerbaum. The signal course U, periodically recurring with the period of the oscillation T is to be measured. For this purpose, a trigger signal Tr, which initiates and indicates the process to be measured has to be generated in the sample to be examined or in its activation. Upon such a trigger pulse, following a delay time $t_D$, a primary electron pulse is generated which results in a pulse-shaped primary electron stream $I_{PE}$. Each primary electron pulse generates a secondary electron pulse, so that a corresponding pulse-shaped secondary electron stream $I_{SE}$ ensues. The minimal shift in time between the primary and secondary electron pulses is caused by the transit time of the electrons between the electron source and the sample and between the sample and the detector, respectively. The attainable time resolution in this process is now only determined by the width of the primary electron pulse, but no longer by the bandwidth of the detector system, with which the secondary electron stream is registered. By slowly shifting the point in time at which a primary electron pulse is generated, that is by varying the delay time $t_D$, the entire signal course of interest of signal U of interest can be scanned. The speed with which the time delay $t_D$ is changed deterimines how many scanned values, respectively measured cycles per scanning point in time are averaged.

Figure 2:
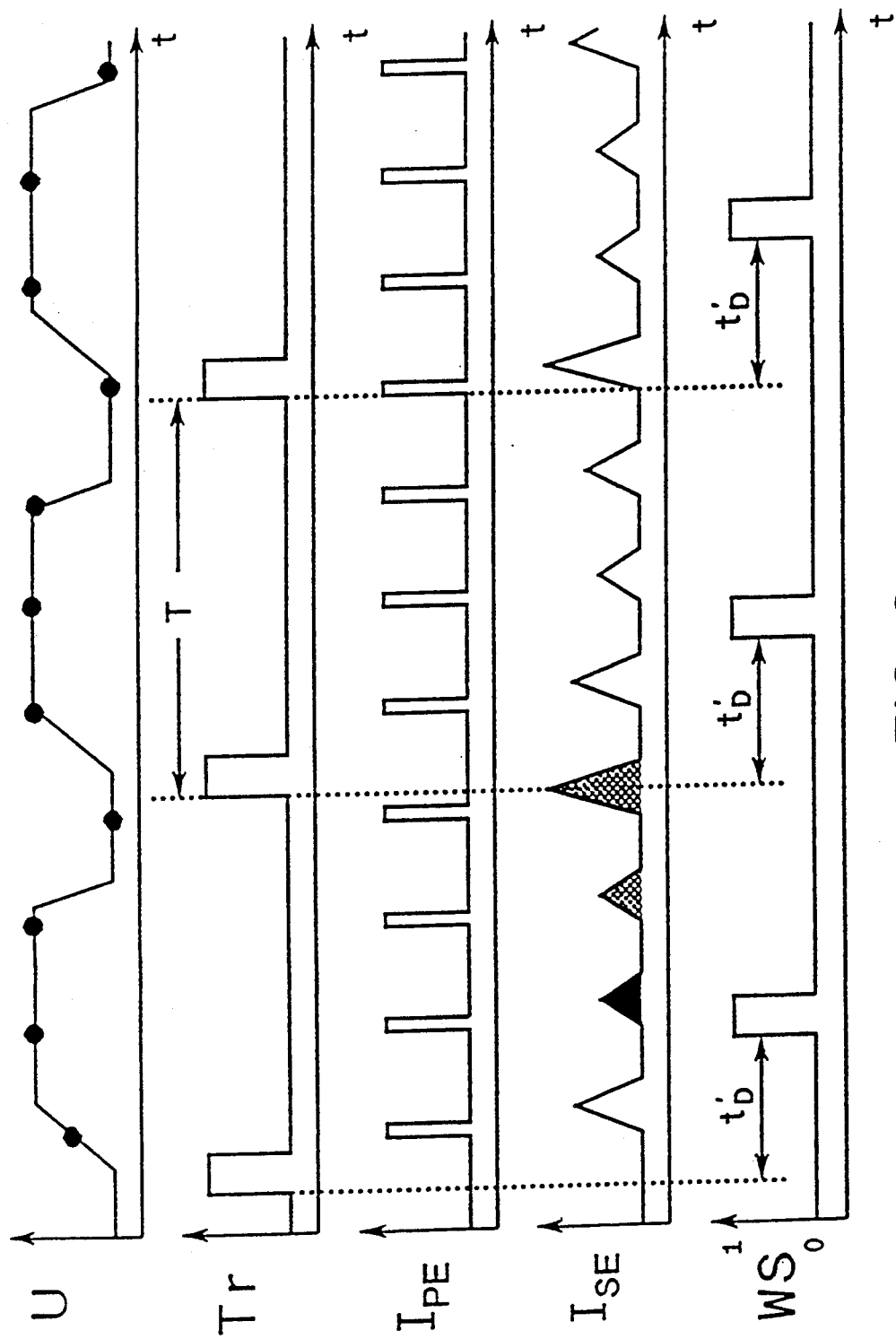
FIG. 2 shows the principle of operation of the invented process using a timing diagram of some of the signals occurring in this process.

In contrast to this, FIG. 2 illustrates how the invented process operates. The signal course U to be measured and the trigger signal Tr—because they are dependent on the process to be examined, but not on the respective measuring process—are identical with those shown in FIG. 1. On the other hand, in the invented process the generation of the primary electron pulses is totally independent of the signal course U to be measured, respectively of the trigger signal Tr, which is synchronous to it. When and how often the primary electron pulses are generated is, in the case of this process, in principle, random, yet it is advantageous if the pulses are generated with a constant repetition frequency as a narrow-banded arrangement for generating primary electron pulses can then be utilized. For this reason, such a case was presumed in FIG. 1. Accordingly, both the primary electron stream $I_{PE}$ and the secondary electron stream $I_{SE}$ have periodic pulses with constant intervals. The signal course U is scanned with these pulses at the points in time (in this specific case equidistant points in time) marked by dots. The results of the scanning are contained as (amplitudinal) information in the individual secondary electron pulses. For this reason, the secondary electron stream $I_{SE}$, and respectively a secondary signal SS derived from it is registered. The bandwidth of the detector system employed for the registration therefore determines the minimal interval of the primary electron pulses.

In order to be able to collocate the individual secondary electron pulses to the respective scanning time points in the signal course U, only the secondary electron pulses are evaluated and further processed, the collocated scanning time points of which lie in a time window of a defined length and defined distance $t_D'$ from the trigger pulse. For this purpose, proceeding from the trigger signal Tr, a window signal Ws is generated defining this time window. In the illustrated case, the time window is characterized by the window signal being then logic number 1. Only the secondary electron pulses generated by the primary electron pulses within this time window are relevant and are evaluated. The other pulses are ignored. In FIG. 2, the pulses considered for evaluation are drawn shaded. The width of the time window determines the achievable time resolution. In order to scan the entire signal course, the window is moved over the time period of interest, i.e. the delay time $t_D'$ is varied accordingly. The speed with which this occurs determines the number of secondary electron pulses per scanning time point over which an average is made during evaluation and therewith determines the signal-to-noise ratio of the measuring results. The movement of the time window may occur steadily as well as seemingly coincidently in discrete steps, as will be explained later on. The averaging procedures known to those skilled in the art like they are already employed in state of the art measuring processes may be used for averaging the secondary electron pulses.

The essential fundamental concept of the invented process is to conduct the generation of the primary electron pulses and therewith the selection of the scanning time points completely asynchronously to the trigger signal, yet only to consider in the evaluation the secondary electron pulses respectively originating from a specific scanning time period of the signal course to be measured, this period of time being defined by the time window.

Figure 3:
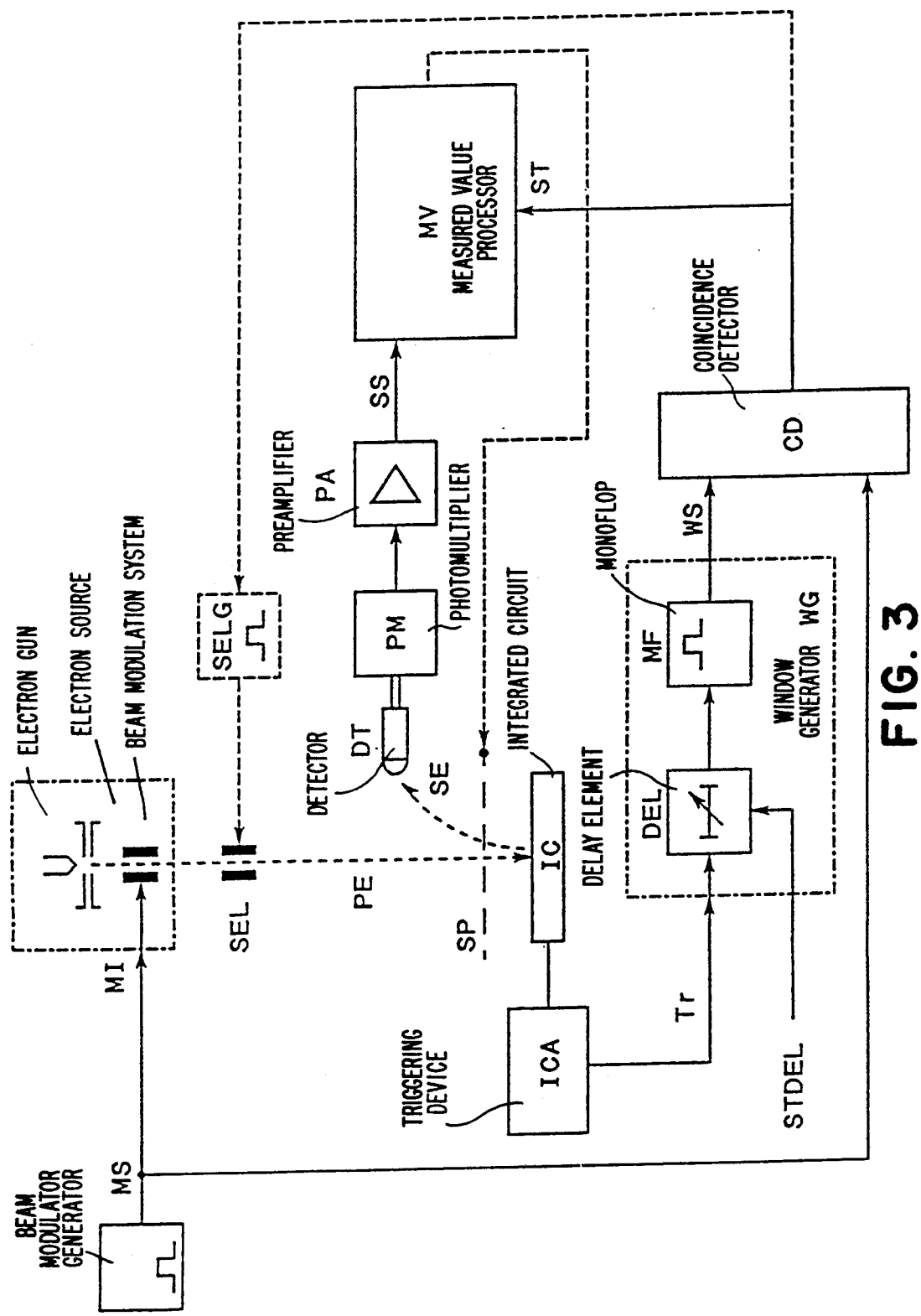
FIG. 3 shows an arrangement for carrying out the invented process.

FIG. 3 shows schematically an arrangement with which the invented process can be realized. The central unit of this arrangement is, by way of illustration, an electron beam measuring device known from U.S. Pat. Nos. 4,220,853 and 4,223,220. A finely bundled primary electron beam PE is generated in the electron-optical column of such an electron beam measuring device. This electron-optical column is provided with an electron source ES, which generates the primary electron pulses, in addition to a great number of shutters and electric or magnetic lens systems for beam formation, beam deflection and beam focussing, not depicted in FIG. 3 and the subsequent figures for reasons of clarity.

The task of the electron source ES is to generate the primary electron pulses. In FIG. 3, it is constructed with an electron gun EG, which is composed of a cathode, which generates the primary electrons by thermal emission, an anode and a Wehnelt electrode, and a beam modulation or scanning system BBS. With the aid of the beam modulation system BBS, the intensity of the primary electron stream continuously delivered is modulated. In this manner, primary electron pulses can be generated. Possible forms of embodiments of electron guns EG and beam modulation system BBS are described, by way of illustration, in the publication "Electron beam chopping systems in the SEM" by E. Menzel and E. Kubalek (Scanning Electron Microscopy, SEM Inc., AMF O'Hare, 1979/I, pages 305-317).

In order to generate the primary pulses, a beam modulator generator BBG is connected to the modulation input MI of the electron source ES. The beam modulation generator BBG triggers the beam modulation system BBS with a modulation signal MS. In this realization, the modulation signal MS is composed of square pulses, which occur with a constant repetition frequency. Other possible ways of triggering the beam modulation system with various signal forms are also described in the cited publication by E. Menzel and E. Kubalek and can also, in principle, be employed. Each square pulse of the modulation signal MS keys the primary electron beam PE briefly and generates, in this manner, a primary electron pulse, the width of the square pulses determining the duration of the primary electron pulses.

The primary electron pulses generated in this way are then focussed by the lens systems, not depicted in FIG. 3, onto the sample IC, by way of illustration an integrated circuit. There the impinging primary electrons PE release secondary electrons SE, which are registered by the detector DT and converted into light pulses. These light pulses are then led via a light guide to a photomultiplier PM, which is usually located outside the sample chamber of the electron beam measuring device and which in turn converts the light pulses into an electric signal, which then, is available, if need be, following further amplification in a preamplifier PA, which is arranged after the photomultiplier PM, as an (in this case electric) secondary signal SS for further evaluation in a measured value processing system MV. As the secondary electrons SE are influenced by the electric potential at the measuring position, the secondary signal SS is determined by the potential at the measuring position and therewith by the voltage waveform U to be measured.

The sample IC to be examined is operated cyclically in order to reproduce the process of interest, e.g. an error. For this purpose, the sample IC is supplied with supply voltages and, if need be, input signals for stimulation by a triggering means ICA. By way of illustration, a function tester can serve as the triggering means ICA, which then also monitors the output signals of the circuit and can thereby ascertain whether the sample IC is operating defectively or not. The triggering means or the sample itself also supplies the trigger signal Tr, which indicates that the process to be examined is occurring in the sample, respectively has occurred in the sample. By way of illustration, the triggering means ICA can always indicate the commencement of a test cycle by a trigger pulse.

Then the window signal WS is obtained from the trigger signal TR with the aid of a window generator WG. A boxcar integrator, in particular Model 163 of the firm Princeton Applied Research, may, by way of illustration, be employed as the window generator. In this event, the trigger signal Tr is transmitted to the trigger input of the boxcar integrator and the window signal WS is tapped at the output of the boxcar integrator, which indicates the opening closing, respectively, of the boxcar gate. Another preferred embodiment of the window generator WG is illustrated in FIG. 3. In this case, the window generator WG is composed of a controllable delay element DEL and a monoflop MF arranged thereafter. The input of the delay element DEL simutaneously forms the input of the window generator WG and the trigger signal Tr is transmitted to it. For this purpose, the input of the delay element DEL is connected to the corresponding output of the IC triggering means ICA, and the sample IC, respectively. The delay element DEL delays the trigger pulse arriving at the input of window generator WG the time $t_D'$. The trigger pulse delayed in this manner appears at the output of the delay element DEL, which is connected to the input of the mcnoflop MF. The monoflop MF is in turn triggered by the delayed trigger pulse and thereupon releases at its output a square pulse, the width of which is determined by the setting of the monoflop. In this way, the output signal of the monoflop is the desired window signal WS and the output of the monoflop MF at the same time represents the output of the window generator WG. In order to conduct the measurement, the delay time $t_D'$ has to be varied in the known manner. A boxcar integrator is able to do this independently. However, it is also possible to feed the window generator WG a control signal STDEL. In the case of the embodiment depicted in FIG. 3, this control signal STDEL is transmitted to a ccntrol input of the delay element. Possible embodiments of the delay element DEL are known to those skilled in the art. By way of illustration, an engine-operated mechanical delay element may come in question. The control signal STDEL controls in this case the armature position of the engine. Especially advantageous may also be employing the digitally programable delay generator AD 9500 of the firm Analog Devices (cf. Analog Devices (ed.): "Linear Products Databook", Norwood, USA, 1988, pages 9-41 ff.). In this electronic device component, the control signal STDEL would be a digital data item, which can be delivered, for example, by a computer.

The window signal WS is transmitted to a first input of a coincidence detector CD, which is connected to the output of the window generator WG. To the second input of the coincidence detector is transmitted a signal, which indicates when a measurement is being conducted with a primary electron pulse. As especially advantageously suited for this purpose is the modulation signal MS, which itself controls the generation of the primary electron pulses. The coincidence detector determines when the measurement with a primary electron pulse is occurring in the time window defined by the window signal. The setup and manner of operation of a coincidence detector is known to those skilled in the art from the literature. A very simple realization of a coincidence detector CD is, by way of illustration, an AND-gate. Quick coincidence detectors can also be realized by non-linear optical components. In this event, the input signals are optical signals, which only effect switching through of the non-linear component if they occur simultaneously and thereby produce especially great light intensity. Other embodiments of coincidence detectors, by way of illustration, are described in the German patents 2842279 and 3523713. The output signal of the coincidence detector thus indicates which of the secondary electron pulses, and respectively the pulses of the secondary signal SS, can be utilized for evaluating the measurement. In order to control the evaluation, the output of the coincidence detector is connected to the control input St of the measurement processing system MV.

The task of measurement processing system MV is to select from the pulses of the secondary singal SS those which are relevant for the formation of the measuring results and, if need be, have them undergo further processing. This processing consists, in particular, of averaging very many individual scannings in order to improve the signal-to-noise ratio. For this purpose, the secondary signal SS is transmitted to a first input, the signal input, of the measurement processing system MV. The second input of the measurement processing system MV, the control input ST, is connected to the output of the coincidence detector CD. The desired measurement signal is available at the output of the measurement processing system. This measurement signal can be processed further, if need be; and, by way of illustration, be utilized for controlling a spectrometer SP. How this is to occur, is known to those skilled in the art as the measurement arrangement does not differ in this respect from conventional processes in electron beam measuring described in the publications cited in the introduction hereto. In order to carry out the measurement, the measurement signal is recorded again in a known manner in dependence on the delay time $t_D'$. By way of illustration, a computer can first set the delay time via the control input STDEL and then tap the respective measured value at the output of the measurement processing system. This is subsequently repeated for several values of the delay time $t_D'$. The setting of the delay time may, in principle, occur as desired, continuously as well as in discrete steps. It is only essential that the entire time period of interest be covered.

Figure 4:
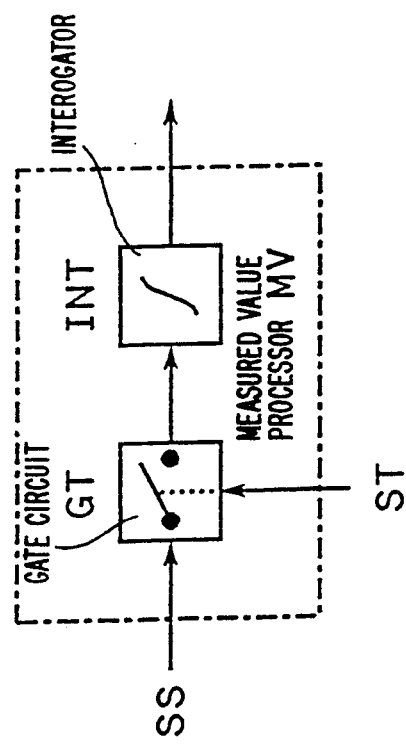
FIG. 4 shows a measured value processing system, as it can be employed in the arrangement of FIG. 3.

FIG. 4 shows a possible embodiment of the measurement processing system MV. In this realization, it is composed of a gate circuit GT on the input side and an integrator INT arranged thereafter. In this realization, a first input of the gate circuit GT is the input of the measurement processing system and the control input is formed by the second, the control input of the gate circuit. The output of the gate circuit GT is connected to the input of the integrator INT. The gate circuit GT switches all the pulses of the secondary signal belonging to the scannings in the time window defined by the window signal WS, through to the integrator INT while the other pulses are ignored. What pulses these are is determined by the coincidence detector CD and is indicated by its output signal. For this reason, the output signal of the coincidence detector CD also assumes control of the gate circuit GT. The subsequent integrator INT averages over the scanned values from numerous scannings of the signal course U effected by the primary electron pulses and improves thereby the signal-to-noise ratio of the measuring results.

If a memory unit, for example a sample & hold circuit controlled by the modulation signal MS, is arranged before the gate circuit GT, the signal course can also be measured before the trigger pulse occurs. It can be especially advantageous if the measurement arrangment is realized with digital components. In this case, the measurement processing system contains an analog-digitial converter on the input side. Memory, switching through and further processing of the digital items appearing at the output of the analogue-digital converter is possible with little effort. The appropriate methods are known to those skilled in the art.

In order to gain the secondary signal SS, an energy spectrometer SP, in particualr, can be put in the system. This is indicated in FIG. 3 by an opposing field network. Especially well suited for this purpose is an opposing field spectrometer as, by way of illustration, is known from the U.S. Pat. No. 4,292,419. How such a spectrometer can be utilized to gain a signal is known to those skilled in the art. An especially simple possibility is, e.g. the application of a constant voltage to the opposing field network.

Figure 5:
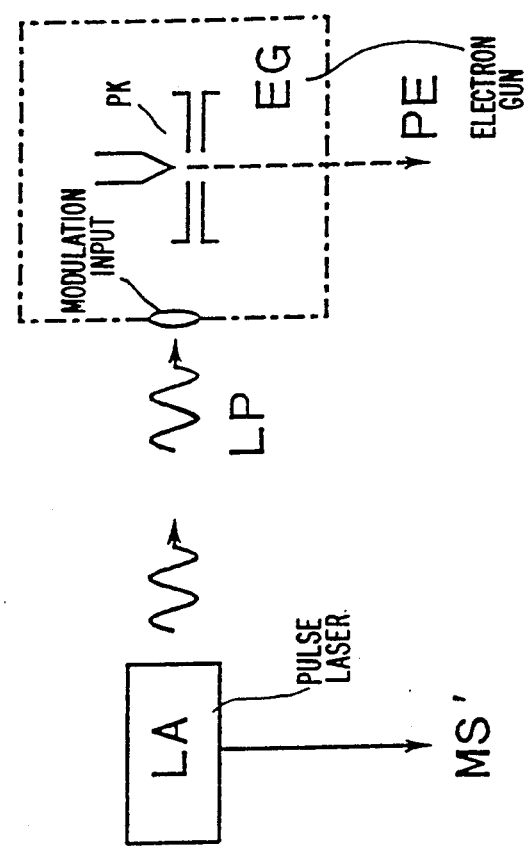
FIG. 5 shows an embodiment of the primary beam source, as it can be employed in the arrangement of FIG. 3.

Naturally, there are also other possible embodiment forms of the electron source ES besides the one depicted in FIG. 3. Thus, e.g. a field emission cathode can replace the heated cathode, which generates primary elctrons PE by thermal emission. A semiconductor cathode may also be employed. In the event of a semiconductor cathode, the intensity of the emission can very simply occur by varying the cathode current. An independent beam modulation system BBS behind the cathode can then be disposed with and the modulation signal MS directly controls the cathode current. Another possible setup of the electron source is schematically illustrated in FIG. 5. In this case, the primary electrons PE are generated by photoemission from a photocathode PK. For this purpose, a pulse laser LA supplies short light pulses, which are focussed via a lens system, not depicted in FIG. 5 for reasons of clarity, through an optical window MI onto the photocathode located in a vacuum and which release short PE-pulses from the photocathode PK by photoemission. A beam modulation system BBS may also be disposed with in this case as the generation of PE already occurs modulated. The modulation input MI is in this event not an electric but an optical input and the modulation signal MS is an optical signal as it is formed by light pulses coming from the laser LA. An electric signal MS', which is synchronous to it can in this case be transmitted to the coincidence detector. Such a signal MS' may, by way of illustration, be obtained from the laser LA. Moreover, a part of the light pulses from laser LA can be guided by a divider mirror to a rapid photodiode and the former's output signal, which corresponds to the modulation of signal MS, can be used as the signal MS'. However, in this event, it may also be very advantageous to realize both the window generator and the coincidence detector optically. The controllable delay element DEL can be optically realized, e.g. very simply as a variable path, which the light pulses have to traverse.

The setup of electron source ES is usually particularly simple if the primary electron pulses are generated with a constant time interval as in that case the modulation of the primary electron beam PE and the beam modulation system BBS can be fixed to the repetition frequency of the primary electron pulses, respectively to a multiple or a part thereof. This constitutes a considerable advantage over the conventional processes, in which the beam modulation system has to be designed very widebanded. Narrowbanded arrangements usually have substantially higher performance power. By way of illustration, very short primary electron pulses can be generated with a type of cavity resonator with a constant repetition frequency. Such an arrangment is described in the afore-cited publications by E. Menzel and E. Kubalek. Even if a conventional beam modulation system composed of a plate condenser with a blanking aperture disposed behind thereof is employed, the narrowbanded triggering of the beam modulation system BBS can be utilized by providing this condenser with an additional coil and tuning the thereby resulting resonance circuit to the desired frequency. Such a system can be very easily triggered with a sinus signal at the resonance frequency. The overdue increase in voltage in the resonance circuit then ensures a particularly high blanking responsiveness and also makes it possible to generate very short primary electron pulses, the duration of which can be determined by the amplitude of the applied sinus voltage.

Sometimes the samples IC to be examined tolerate only little charging by the primary beam PE. In such samples therefore the number of primary electron pulses impinging upon the sample should be kept as small as possible. For this purpose, the generation of primary electron pulses or their forwarding to the sample IC can be restricted to a selectable time window, the position of which is defined in reference to the trigger signal Tr. Technically, this can be simply achieved by arranging a gate circuit before the modulation input MI, which can block the modulation signal. In the case of the system of FIG. 3, by way of illustration, a PIN diode circuit comes into consideration therefor, in the case of the system of FIG. 5, a Pockels cell. If the beam modulation generator BBG has a "gated" type of operation, the gate input of the generator can also be triggered instead of an additonal gate circuit. If, by way of illustration, only the voltage waveform U following the trigger signal is of interest, the gate circuit, and respectively can be the beam modulation generator BBG can be switched free solely for this period of time of interest by a mcnoflop circuit triggered by the trigger signal TR. However, if processes before the trigger occurrence are also to be measured, this cannot be applied. If, however, it is known that the signal course U to be measured can only occur with a maximum repetition frequency, the gate circuit, and respectively, the beam modulation generator BBG again triggered by the trigger signal Tr can be blocked for a specific time span (which, of course, should be smaller than the minimal period of oscillation of the signal course U to be measured) following the trigger occurrence and thereby avoid charging the sample unnecessarily.

A disadvantage of the afore-described embodiment of the invented process is the, under circumstances, somewhat low effective measuring rate as only a small part of the cycles of the signal course U to be measured actually can be utilized for forming the measuring results. The measuring rate can, however, be raised by conducting not only single but N measurements per determined coincidence of a scanning by a primary electron pulse and of the time window defined by the window signal WS. In order to do this it is necessary to always detect the N values of the secondary electron stream $I_{SE}$ of the secondary signal SS per coincidence separately. A prerequisite for the correct collocation of the detected values to the scanned point of the signal course U is, however, that the temporal intervals of the primary electron pulses are known. In the simplest case of temporally equidistant primary electron pulses this is given and in the following section it will be proceeded therefrom. The additionally detected and evaluated values of the secondary electron stream, respectively secondary signal (SS, may lie at random before (pretrigger) or behind (posttrigger) the trigger signal Tr, respectively before or after the window signal Ws. In FIG. 2, the corresponding pulses for N=3 and the pretrigger case are shown shaded. The delay time $t_D'$ then only has to cover the Nth part of the overall time period of interest. If thus the entire oscillation period T is to be measured, $t_D'$ only has to be varied between $t_D'=0$ and $t_D'=T/N$ as in that event, by way of illustration, the first registered value of the secondary signal SS in a coincidence lies between 0 and T/N, the subsequent one covers the range T/N to 2T/N and the ith-value finally represents the signal to be measured in the range $(i-1)T/N$ to $iT/N$. The measurement curve can be reconstructed without difficulty from the values of the secondary signal SS detected in this manner and, if need be, averaged over many measuring cycles in order to improve the signal-to-noise ratio by lining up the measured values from the individual subranges in correct temporal order.

Figure 6:
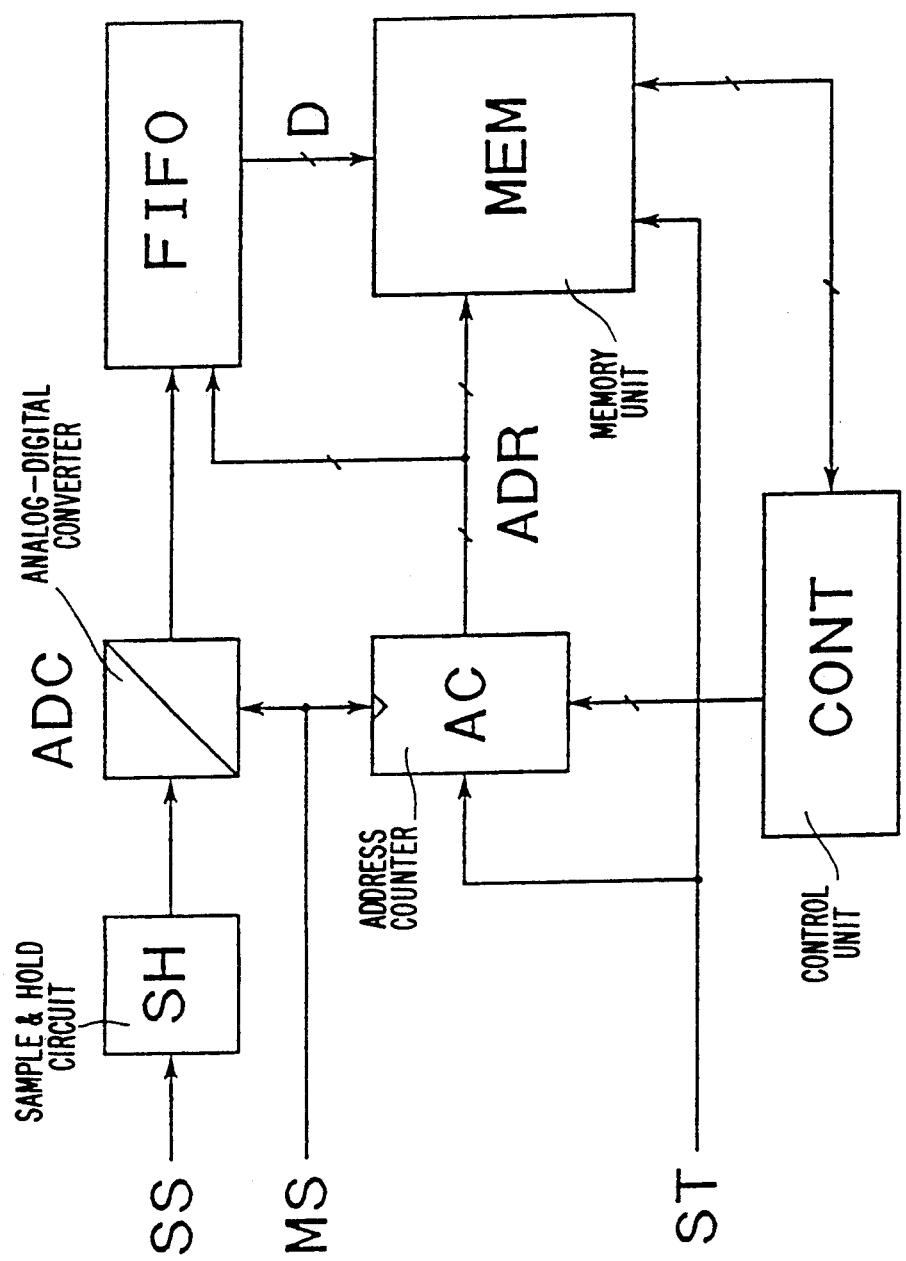
FIG. 6 shows an embodiment of the measured value processing system for the multi-sampling variant of the invented process.

FIG. 6 shows a measurement processing system MV suited for this embodiment of the process, referred to as multisampling variant hereinafter. The measurement processing system contains a sample&hold circuit SH, an analogue-digital converter ADC, a rapid memory FIFO, an address counter AC and a memory unit MEM. The control unit CONT may be designed as part of the measurement processing system MV as well as an independent unit, for example in the form of the control computer regulating the entire measuring arrangement. The secondary measurement signal SS, the modulation signal MS, respectively a synchronous signal (e.g. MS') thereto, and the output signal of the coincidence detector CD—this signal is transmitted to the control input ST—are transmitted to the entire measurement processing system. The secondary signal SS reaches the input of the sample&hold step SH and is scanned by it whenever a secondary electron pulse occurs. The temporal control of the scanning process ensues via the modulation signal MS, if need be, time-delayed to compensate for the transit time of the electrons, which is applied to the control input of the sample&hold step. The output of the sample & hold step SH is connected to the input of the analogue-digital converter ADC, which converts the scanned values of the secondary signal SS into digital values. In the simplest case, the analogue-digital converter ADC only consists of a rapid comparator as a 1-bit-A/D converter. The output signal of the analogue-digital converter ADC is read into a rapid memory FIFO, preferably a FIFO memory (first in first out). Addressing the memory positions, into which is read in each case, occurs via the address counter AC. In order to do this, the address counter AC delivers the address signal ADR to the rapid counter FIFO.

The modulation signal MS is transmitted to the address counter as a timing signal. In this manner, the scanned values of the secondary signal are read into the rapid memory FIFO cyclically. The control input St is connected to the stop input of the address counter AC as well as the memory unit MEM. As soon as the coincidence detector CD detects a coincidence, the address counter is stopped via this input so that the last N scanned values, which occurred prior to the coincidence (pretrigger), are in the rapid memory FIFO. Alternatively, the address counter may be allowed to continue counting for a few more timing cycles and thereby also detect measured values following the coincidence (posttrigger). These values are then transferred via the data line D to the memory unit MEM (again controlled via the control input ST). This transfer itself may occur relatively slowly so that the memory unit MEM can be designed as a relatively slow and therefore low cost memory with little access speed. Only the small (in principle, it only has to store N measured values) rapid memory FIFO has to have high access speed as it is timed by the repetition rate of the primary electron pulses. In addition, the control unit CONT also has access to the address counter AC and the memory unit MEM via the data lines. In this manner, it can read out the measured values from the memory unit MEM, if need be, average them and reconstruct the measurement curve therefrom in the previously described way.

According to a further embodiment of the invented process, which is to be referred to as the multi-coincidence variant, the measuring time can be shortened by raising the probability of a coincidence occurrence. This is realized by generating not only a single window signal WS but M window signals WS1...WSM, which are respectively staggered by the known time $t_0...t_{M-1}$ ($t_0 = 0$). Subsequently, in parallel to this is checked whether a coincidence of a primary electron pulse has occurred with one of these window signals WS1...WSM and the corresponding value of the secondary signal is detected in the known manner and stored. At the same time it is also stored at which window signal and thereby at which time delay the coincidence occurred. With this data, the respective measured value can be distinctly collocated to a temporal scanning point in the signal course to be measured and thereby the measured curve to be obtained.

Figure 7:
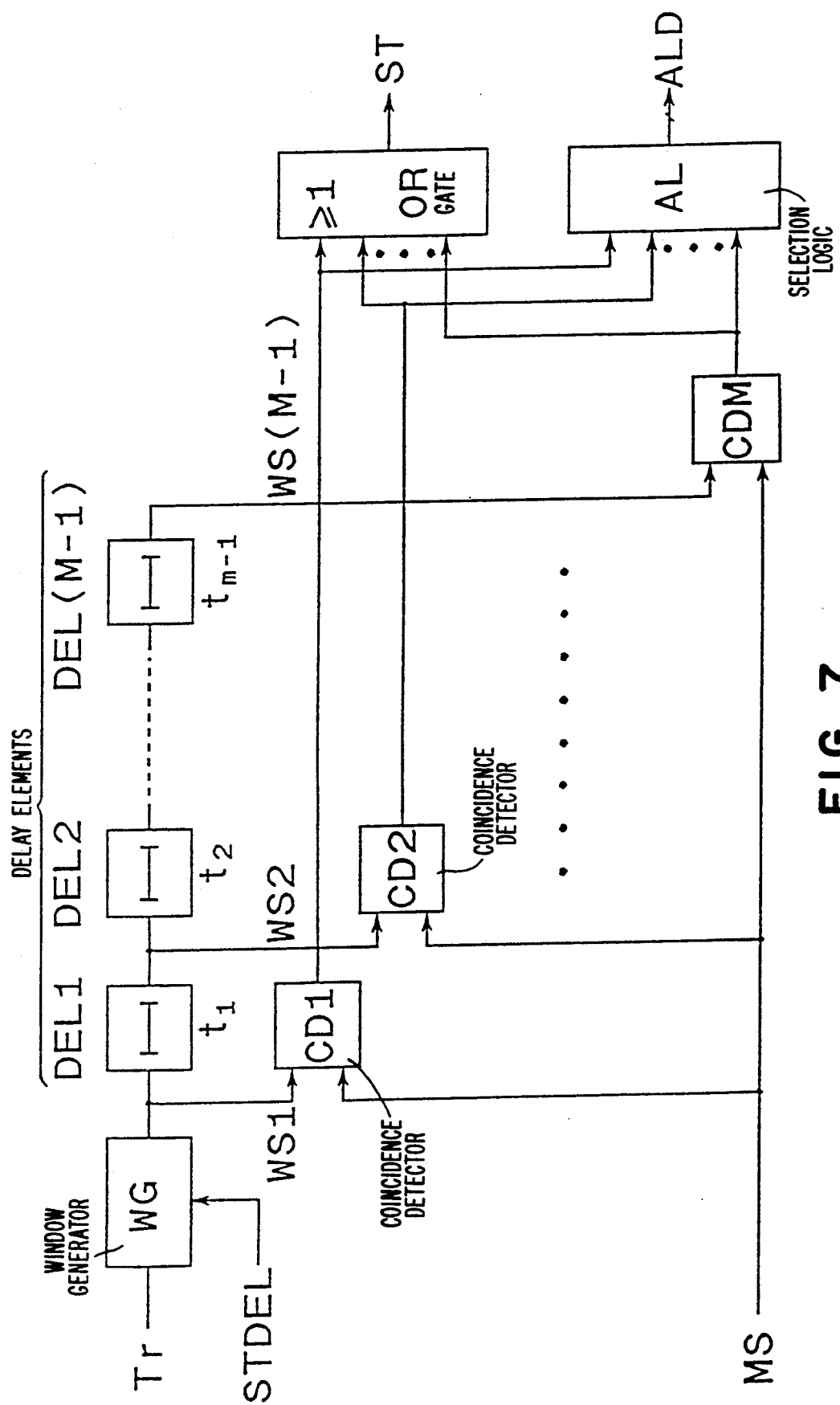
FIG. 7 shows an expansion of the arrangement of FIG. 3 for carrying out the multi-coincidence variant of the invented process.

FIG. 7 shows the expansion required for the multi-coincidence variant of the measuring system according to FIG. 3. In order to generate the time-shifted window signal WS1...WSM, a chain of consecutively switched delay elements DEL1...DEL(M-1), which delay the output signal from the window generator WG the time $t_1...t_{M-1}$, is arranged behind the window generator G. The chain of delay elements are realized with equidistant single tappings. The window signals WS1...WSM are tapped at the outputs of the delay elements and respectively transmitted to the first input of M coincidence detectors CD1...CDM switched in parallel. To the second input of the coincidence detectors, analogue to the realization of FIG. 3, is applied the modulation signal MS or a signal, which is synchronous to it (e.g. MS'). The outputs of the coincidence detectors CD1...CDM are connected to the inputs of an OR-gate OR as well as to the inputs of a selection logic AL. The OR-gate generates the control signal ST, which indicates that a coincidence has occurred. The selection logic generates a data item ALD, which indicates at which coinicidence detector the coincidence was registered. This data item ALD is transmitted to the memory unit MEM and stored there together with the registered measured value MEM. This storing may occur in such a manner that the data item ALD is utilized as a partial address signal for the memory unit MEM and thereby controls the position, at which the measured value is stored in the memory unit. Obtaining the measured curve is simple with these data. If the delay elements DEL1...DEL(M-1), by way of illustration, all have the same delay $t_1$ and if the ith coincidence detector registers a coincidence, the corresponding value of the secondary signal SS comes from the signal course to be measured at the point in time $t_D' + (i-1)t_1$ relative to the trigger signal Tr.

In the invented process—and the same of course holds true for all the variants thereof—the essential point is the relative temporal position between the trigger signal Tr and the primary electron stream $I_{PE}$. For this reason, the window signal WS can also be triggered by the modulation signal MS or a signal, which is synchronous thereto (e.g. MS') and subsequently the coincidence can be detected with a flank of the trigger signal Tr. This is recommendable whenever the repetition rate of the trigger signal is higher than that of the primary electron pulses. For the measuring arrangement this means that the window generator WG receives the modulation signal MS or a signal synchronous thereto as its input signal and its output is connected to the second input of the coincidence detector CD instead of the first input thereof. The trigger signal Tr is directly applied to the first input of the coincidence detector. Generally it can be said that the window generator WG is especially easy to realize if it lies in the low frequented input branch of the coincidence detector.

In the hitherto described embodiments of the invented process, the secondary electron detector DT has to transfer the individual secondary electron pulses separately. In order to achieve a low measuring time, the detector system therefore should be as fast as possible. If, however, a slow detection system is desired, perhaps for cost reasons, according to another embodiment of the process, which shall be referred to hereinafter as the preselection variant, the selection of the relevant measured, respectively scanned, values can already be carried out in the modulation signal MS or in the primary electron stream $I_{PE}$ or in the secondary electron stream. For this purpose, the modulation signal MS, respectively the primary electron beam PE, respectively the secondary electron stream $I_{SE}$ is blocked via a selection means SEL and only cleared briefly after a coincidence has been detected. The detection of the secondary signal can then ensue slowly like in conventional state of the art waveform measuring processes as now, on principle, only values of the secondary signal occur, which are really relevant to the measuring result.

Figure 8:
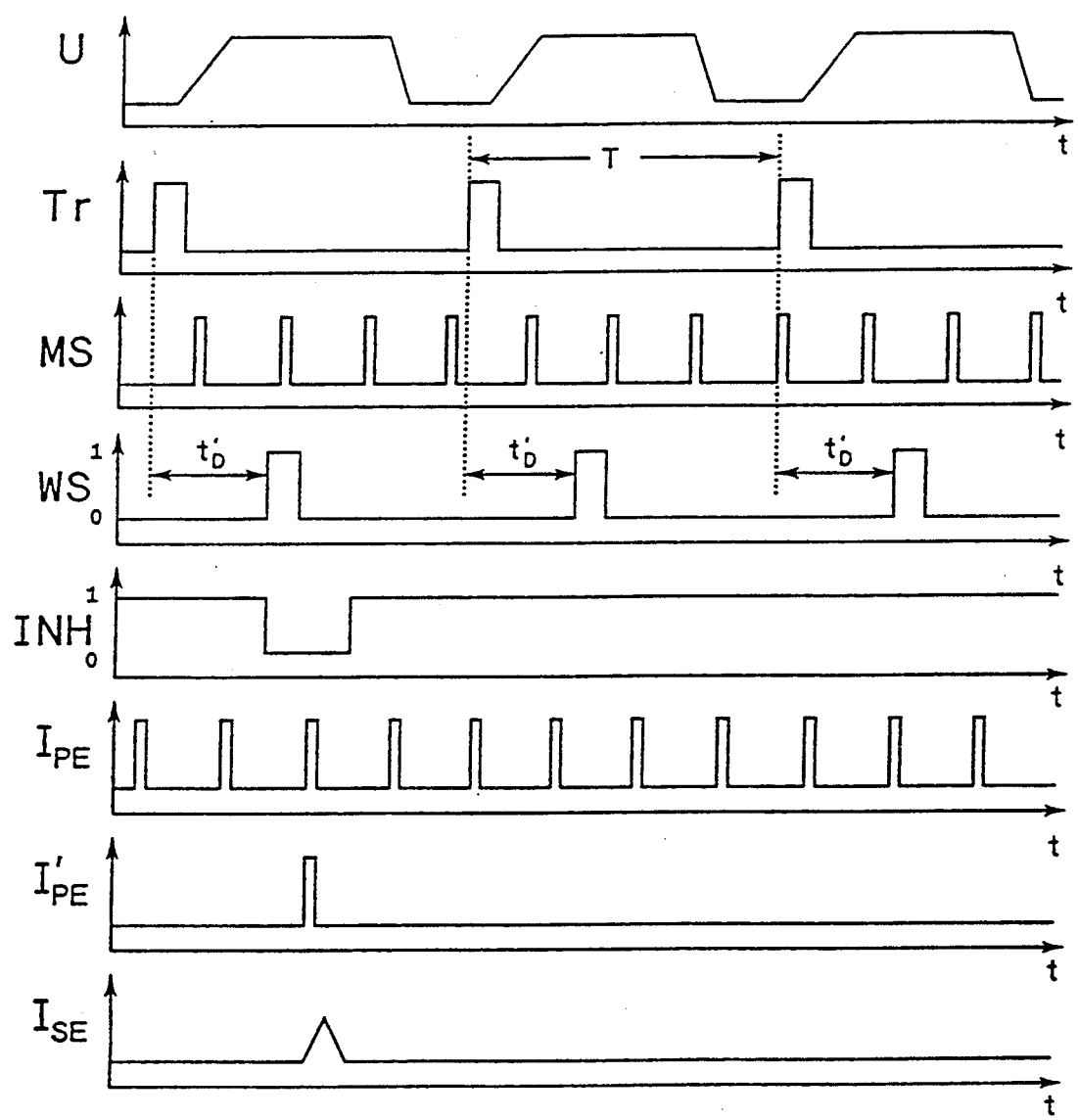
FIG. 8 shows the principle of operation of the preselection of the invented process using a timing diagram of an occurring signal.

FIG. 8 illustrates this embodiment using the preselection in the primary beam PE. Depicted are the signal courses, already depicted in FIG. 3, of the signal U to be measured, of the trigger signal Tr, of the window signal WS and of the primary electron stream $I_{PE}$ directly after the electron source ES. In addition to that, the modulation signal MS is shown. If a coincidence is detected between the window signal WG and a pulse of the modulation signal MS (which is equivalent to a primary electron pulse), the selection means SEL is cleared via a selection signal INH, which then goes to logic 0 in the illustrated example and the primary electron pulse corresponding to the coincidence reaches the point of measurement. The primary electron stream directly at the point of measurement is designated $I_{PE}'$. As the individual pulses follow each other at relatively large intervals, no special demands are made upon the quality of the selection means SEL.

The necessary expansion of the measurement arrangement for this event is drawn with broken lines in FIG. 3. The output signal of the coincidence detector CD is transmitted to the input of the selection generator SELG, which generates the selection signal INH and delivers it to the selection means SEL, in this case a second beam modulation system. If a plate condenser is utilized as the beam modulation system BBS, the second plate of this condenser (the modulation signal is applied to the first plate) can also be advantageously employed as the selection means SEL. Analogously a preselection can also be carried out in the modulation signal MS or in the secondary electron stream $I_{SE}$. In the arrangment according to FIG. 5, by way of illustration, a Pockels cell inserted between the laser LA and the modulation input MI or an electro-optical modulator can find use. For the selection in the secondary electron stream, it can be very advantageous to employ the opposing field network of an opposing field spectrometer by applying a strong opposing field for blocking and thereby preventing the secondary electrons from reaching the detector DT. Moreover, the gate circuit GT in FIG. 4 can also be regarded as a kind of selection means (for selection in the secondary signal SS).

The previously described variants multi-sampling, multi-coincidence and preselection may be utilized not only individually but also quite advantageously in random combination.

Although the invented process hitherto was only described for waveform measuring, in which the primary electron beam is positioned only on a single measuring position, fundamentally it can be utilized in all measuring techniques using a stroboscope or scanning process. In the field of electron beam measuring, the processes "logic state mapping" and "timing diagram", for example, should be mentioned. In these processes, the primary beam PE scans individual points, a line or a part of a surface of a sample and is not aimed stationarily at one point. If the invented process is also to be utilized in this case, position data of the position from which the measured values originate to be recorded in addition to the measured values of the secondary signals SS. How such position data is determined, for example in the form of deflection voltages delivered by the raster generator, is known to those skilled in the art. When the measurements are evaluated, each indivdual measurement can be unequivocally collocated to a specific measuring position using the stored position data. In this event, too, an averaging should be conducted if several measured values are recorded for the same period of time from the same position. How the primary beam PE moves over the sample during the measurment and in what sequence the individual measuring positions are scanned is of absolutely no significance. The movement of the primary beam PE also does not necessarily have to be coupled to the measurement. In this case, too, the conventional scanning techniques of electron beam measuring known to those skilled in the art may be utilized.

The present invention has hitherto been described using the potential contrast effect in an electron beam measuring apparatus. Its application is however by no means restricted thereto. Any other corpuscles, e.g. ions or any radiation, in particular radiation of light, may be used instead of the primary and secondary electrons. If, by way of illustration, a laser beam is employed as the primary beam PE, it can release photoelectrons on the surface of the sample, which, due to the potential contrast, are influenced by the electric fields on the surface of the sample and can, as previously described, be detected as secondary electrons. However, other interactions can take the place of the potential contrast, to which, by way of illustration, belongs the influencing of the secondary electrons SE generated by a primary electron beam PE by a magnetic field. By utilizing this so-called "magnetic contrast", it would be possible to examine the movement of magnetic domains in magnetic bubble memories. In addition, the secondary signal SS by no means has to emanate from a secondary corpuscle stream, which is registered with the aid of a detector. Just as, by way of illustration, the secondary signal can be directly derived from the sample by, e.g., measuring the current induced by the primary beam PE in the sample IC. An example of this kind of technique is the EBIC (electron beam measuring induced current) method well-known to those skilled in the art.

Naturally, the various modifications may also be combined and thus employed. Again if a laser beam is used as the primary beam PE and an integrated circuit as the sample IC, the laser beam can generate electron hole pairs in the pn-junctions of the sample IC and thereby free charge carriers. This subsequently makes itself noticeable in the change in the current capacity of the sample IC. How great this change is depends on the circuit condition of the respective pn-junction. A change in the circuit condition of a pn-junction can therefore be easily detected by measuring the supply current of the sample IC. The supply current of the sample, respectively its deviation from the quiescent current, can in this case serve as directly as the secondary signal SS, a special detector is not required. Also, a laser beam can be utilized as a primary beam in order to measure the surface potential of the sample IC. The interactions are in this event electro-optical effects. For this purpose, an electro-optical crystal is arranged on the surface of the sample. In order to obtain the secondary signal, the primary beam PE may be aimed at the electro-optical crystal and the reflected light guided over a polarisator and transmitted to a detector, by way of illustration a photomultiplier. When the electro-optical crystal turns the polarization plane in dependence on the surface potential of the sample, the photomultiplier delivers at its output a signal, the signal height of which depends on the surface potential of the sample and can therefore be used as the secondary signal.

The present invention is also not to be understood in such a way that the primary beam PE only irradiates the measuring position finely focussed, but rather that it is also possible within the scope of the present invention that it irradiates large areas and that the definition of the measuring position does not occur until the secondary signal SS has been obtained position-resolved. An example of such an application is measuring surface potentials with photoelectrons by means of potential contrasts. For this purpose the sample may be irraditated with light over its entire surface (the primary beam PE is thus in this case very greatly widened) and the resulting photoelectrons SE can then be registered separately with the aid of a multi-channel detector according to their position of origin and transformed to a secondary signal. Moreover, the measurement can occur on the sample without being at all position-resolved, but rather the sample itself belongs to the measurement arrangement and a signal U applied to the sample IC is to be measured.

What is claimed is:

1. A process for measuring the state and/or temporal course of a recurring signal at least at one point in time and at least at one measurement point of a sample, the process comprising the steps of:

providing a trigger signal which stands in a defined temporal relationship to the course of said recurring signal;

impinging a primary beam upon said sample, the primary beam being formed of individual primary beam pulses which are at least one of primary corpuscular and primary radiation pulses, said primary beam pulses being generated asynchronously and independently of the course of said recurring signal and thus the trigger signal;

generating and controlling said primary beam pulses via at least one of a first modulation signal and independently from external control while providing a second modulation signal synchronous to said primary beam pulses wherein at least one of said individual primary beam pulses and said first and second modulation signals consecutively follow one another at random temporal intervals;

deriving a secondary signal having values influenced from an interaction between said primary beam and said sample;

performing at least one of registering and recording of at least a part of the values of said secondary signal resulting from said interaction between said primary beam and said sample;

processing the values of said secondary signal to a measured value including the steps of:

selecting the values for processing in such a manner that only values resulting from said interaction between said primary beam and said sample occurring at points in time having a defined temporal relationship to said trigger signal and to said recurring signal, respectively, contribute to said measured value.

2. A process according to claim 1, wherein said selecting step is performed in at least one of said modulation signal, said primary beam, and during a formation of said secondary signal.

3. A process according to claim 1, wherein said selecting step comprises the steps of:

defining said defined temporal relationship by at least one time window having a finite width and a time delay in reference to said trigger signal; and contributing to said measured value only those values of said secondary signal resulting from said interaction at points in time within said time window.

4. A process according to claim 1, wherein said mentioned process steps are consecutively performed several times.

5. A process according to claim 3, further comprising the steps of:

varying said time delay and recording said measured value in dependence on a selected time delay.

6. A process according to claim 1, wherein said step of deriving is carried out with a detector.

7. A process according to claim 1, wherein said step of deriving is carried out with a spectrometer.

8. A process according to claim 1, wherein said interaction between said primary beam and said sample includes the steps of:

generating secondary electrons with said primary beam and subsequently influencing said secondary electrons by a potential difference.

9. A process according to claim 1, wherein said interaction between said primary beam and said sample includes the steps of:

generating secondary electrons with said primary beam and subsequently influencing said secondary electrons by a magnetic contrast.

10. A process according to claim 1, wherein said interaction between said primary beam and said sample is an EBIC effect.

11. A process according to claim 1, wherein said interaction between said primary beam and said sample is an electro-optical effect.

12. A process according to claim 1, further comprising the step of obtaining position data of a measuring position for at least one of registering and recording.

13. A process according to claim 12, further comprising the steps of deflecting said primary beam over said sample and wherein said step of obtaining position data gives the measuring position of said primary beam on said sample.

14. A process according to claim 1, wherein several measured values are formed in parallel from the operation of said selection step using several selection criteria.

15. A process for measuring the state and/or temporal course of a recurring signal at least at one point in time and at least at one measurement point of a sample, the process comprising the steps of:

providing a trigger signal which stands in a defined temporal relationship to the course of said recurring signal;

impinging a primary beam upon said sample, the primary beam being formed of individual primary beam pulses which are at least one of primary corpuscular and primary radiation pulses, said primary beam pulses being generated asynchronously and independently of the course of said recurring signal and thus the trigger signal;

generating and controlling said primary beam pulses via at least one of a first modulation signal and independently from external control while providing a second modulation signal synchronous to said primary beam pulses wherein at least one of said individual primary beam pulses and said first and second modulation signals consecutively follow one another at constant temporal intervals;

deriving a secondary signal having values influenced from an interaction between said primary beam and said sample;

performing at least one of registering and recording of at least a part of the values of said secondary signal resulting from said interaction between said primary beam and said sample;

processing the values of said secondary signal to a measured value including the steps of:

selecting the values for processing in such a manner that only values resulting from said interaction between said primary beam and said sample occurring at points in time having a defined temporal relationship to said trigger signal and to said recurring signal, respectively, contribute to said measured value.

16. An arrangement for measuring the state and/or temporal course of a recurring signal at least at one measurement point of a sample, comprising:

a primary beam source generating a modulated primary beam independent and asynchronous from the course of the recurring signal;

a guiding device for guiding said primary beam on said sample to interact therewith;

a secondary signal deriving circuit for deriving a secondary signal having values from said sample, said secondary signal being influenced by the interaction between said primary beam and said sample;

a measurement processing circuit for registering and-/or recording the values of said secondary signal resulting from said interaction between said sample and said primary beam and for processing said values to a measured value; and a time window defining circuit for defining at least one time window in reference to said recurring signal, said recurring signal controlling at least one of the measurement processing circuit and a selection device in a manner such that only those values of said secondary signal resulting at points in time within said at least one time window are utilized for forming said measured value.

17. An arrangement according to claim 16, wherein said primary beam source comprises an electron gun for generating an unmodulated stream of primary corpuscles and a beam modulation system arranged thereafter.

18. An arrangement according to claim 17, wherein said beam modulation system is operated at resonance.

19. An arrangement according to claim 16, wherein said primary beam source comprises an electron gun, which itself already generates a modulated stream of primary corpuscles, and provides a first modulation signal, which is synchronous to said modulated stream of said primary corpuscles.

20. An arrangement according to claim 19, wherein said electron gun comprises a semiconductor cathode, the primary corpuscle emission of which can be controlled by a current through the cathode.

21. An arrangement according to claim 19, wherein said electron gun comprises a photocathode which can be stimulated by light pulses to emit primary corpuscle pulses.

22. An arrangement according to claim 16, wherein a beam modulation generator transmits, via a modulation input to said primary beam source, a second modulation signal, which effects a modulation of the primary beam.

23. An arrangement according to claim 22, wherein said beam modulation generator includes a pulse laser and wherein said modulation signal is composed of individual light pulses and said modulation input is an optical input.

24. An arrangement according to claim 16, wherein said time window defining circuit comprises at least one delay unit and one coincidence detector arranged thereafter.

25. An arrangement according to claim 24, wherein said delay unit, to the input of which a trigger signal is applied, is arranged before a first input of said coincidence detector and said modulation signal or a signal which is synchronous to it, has its output transmitted to a second input of said coincidence detector.

26. An arrangement according to claim 24, wherein said delay unit, to the input of which said modulation signal or a signal which is synchronous to it, is applied, is arranged before a first input of said coincidence detector and a trigger signal is transmitted to a second input of said coincidence detector.

27. An arrangement according to claim 16, wherein said time window defining circuit comprises several coincidence detectors connected in parallel, which are applied by a plurality of delay units having a plurality of staggered window signals wherein the outputs of said coincidence detectors are connected to the inputs of an OR-circuit and a selection logic, which indicates in code which coincidence detector determined a coincidence.

28. An arrangement according to claim 27, wherein the output signal of said coincidence detector, and respectively of said OR-circuit, is connected to at least one of a control input of said measurement processing circuit and a selection device for the selection in said modulation signal or in said primary beam or during said formation of said secondary signal or in said secondary signal itself.

29. An arrangement according to claim 16, wherein said measurement processing circuit comprises an analog digital converter having a rapid memory arranged thereafter; and an address counter, which is timed by said signal which is synchronous to the modulation signal, the output of said address counter being connected to address lines of said rapid memory and the stop-input of said address counter forms the control input of said measurement processing circuit.

* * * * *